(12) United States Patent
Lee et al.

(10) Patent No.: US 8,114,302 B2
(45) Date of Patent: Feb. 14, 2012

(54) METHOD OF FABRICATING CANTILEVER TYPE PROBE AND METHOD OF FABRICATING PROBE CARD USING THE SAME

(75) Inventors: Han-Moo Lee, Seoul (KR); Yong-Hwi Jo, Bucheon (KR)

(73) Assignee: Phicom Corporation, Seoul (KR)

( * ) Notice: Subject to any disclaimer, the term of this patent is extended or adjusted under 35 U.S.C. 154(b) by 660 days.

(21) Appl. No.: 12/308,012

(22) PCT Filed: May 16, 2007

(86) PCT No.: PCT/KR2007/002390
§ 371 (c)(1),
(2), (4) Date: Dec. 4, 2008

(87) PCT Pub. No.: WO2007/142413
PCT Pub. Date: Dec. 13, 2007

(65) Prior Publication Data
US 2009/0173712 A1    Jul. 9, 2009

(30) Foreign Application Priority Data
Jun. 7, 2006    (KR) .................. 10-2006-0050717

(51) Int. Cl.
*B44C 1/22*    (2006.01)
(52) U.S. Cl. .................... 216/11; 438/694; 438/703
(58) Field of Classification Search .................. 216/11
See application file for complete search history.

(56) References Cited

U.S. PATENT DOCUMENTS

| | | | |
|---|---|---|---|
| 5,116,462 A | 5/1992 | Bartha et al. | |
| 5,347,226 A * | 9/1994 | Bachmann et al. | 324/724 |
| 6,756,583 B2 | 6/2004 | Yamawaki | |
| 6,756,584 B2 | 6/2004 | Hantschel et al. | |
| 7,081,624 B2 * | 7/2006 | Liu et al. | 250/306 |
| 2004/0018752 A1 | 1/2004 | Lee et al. | |
| 2005/0051515 A1 * | 3/2005 | Nam | 216/27 |

(Continued)

FOREIGN PATENT DOCUMENTS

CN    1618124 A    5/2005
(Continued)

OTHER PUBLICATIONS

International Search Report for PCT/KR2007/002390 dated Aug. 27, 2007.

(Continued)

*Primary Examiner* — Shamim Ahmed
*Assistant Examiner* — Bradford Gates
(74) *Attorney, Agent, or Firm* — Jenkins, Wilson, Taylor and Hunt, P.A.

(57) ABSTRACT

Disclosed is a method of fabricating a cantilever type probes. According to this method, after forming grooves each in tip portion and dummy tip portion regions of a substrate, the tip portion and dummy tip portion are formed with filling the grooves of the tip portion and dummy tip portion regions. A sacrificial layer is formed to cover the dummy tip portion region including dummy tip portion. A beam portion is formed in connection with the tip portion, extending upward the dummy tip portion including the sacrificial layer. The method includes steps of selectively etching the substrate of the tip portion and floating the tip portion from the substrate. Accordingly, it minimizes physical and chemical damages on the tip portion while fabricating a probe card, providing stability thereto with smaller defects of the tip portion.

16 Claims, 11 Drawing Sheets

U.S. PATENT DOCUMENTS

2008/0079453 A1  4/2008  Lee

FOREIGN PATENT DOCUMENTS

| | | |
|---|---|---|
| DE | 10297653 T5 | 4/2005 |
| JP | 05299015 A | 11/1993 |
| JP | 2003-121469 A | 4/2003 |
| JP | 2004-184237 A | 2/2004 |
| JP | 2005/517192 A | 6/2005 |
| JP | 2006-038427 | 2/2006 |
| KR | 10 2006 0027423 A | 3/2006 |
| WO | WO 2007/142413 A1 | 12/2007 |

OTHER PUBLICATIONS

Written Opinion for PCT/KR2007/002390 dated Aug. 27, 2007.

* cited by examiner

[Fig. 1]
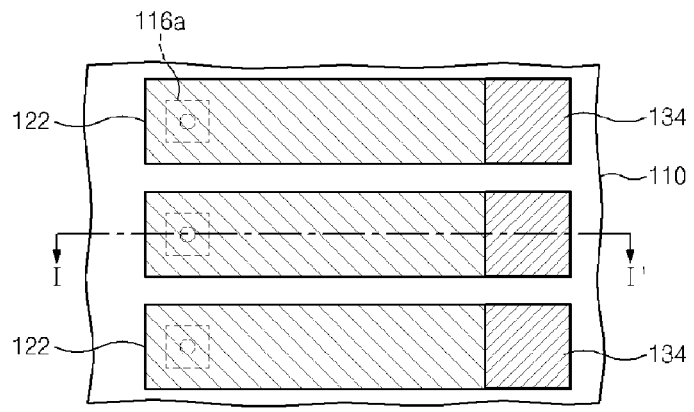
[Fig. 2]
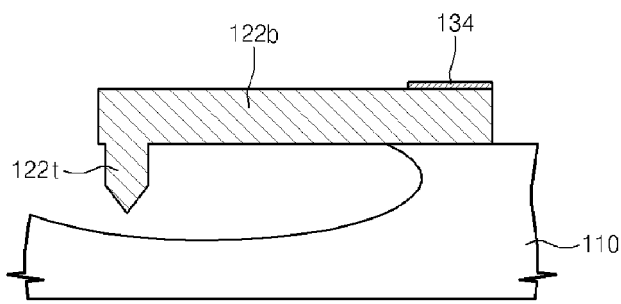
[Fig. 3]
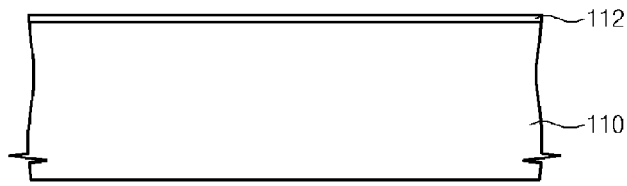
[Fig. 4]
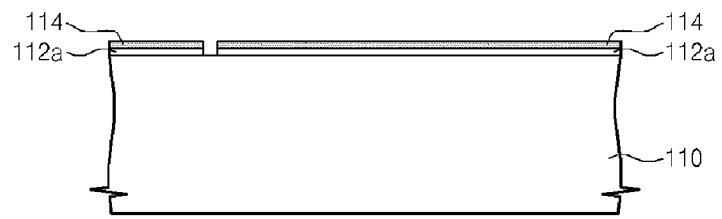
[Fig. 5]
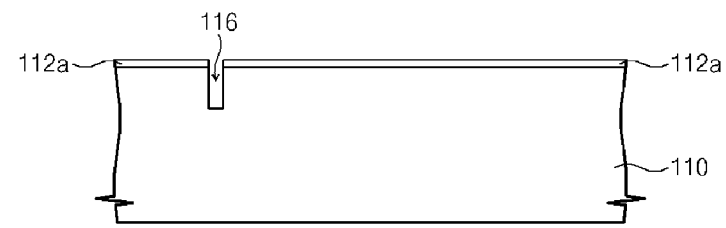

[Fig. 6]
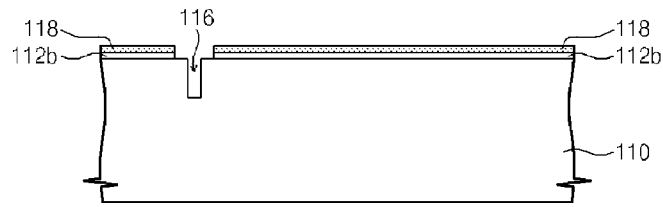
[Fig. 7]
[Fig. 8]
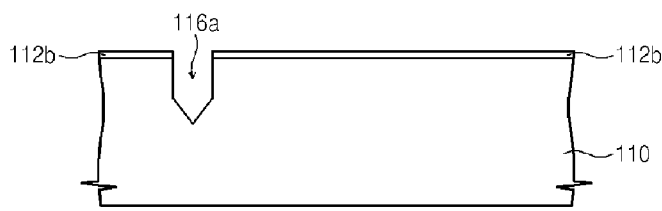
[Fig. 9]
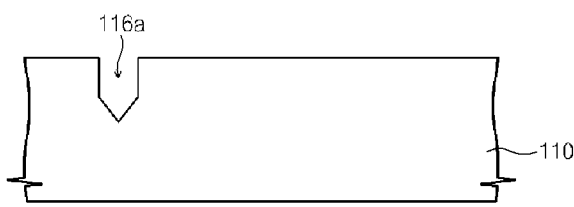
[Fig. 10]
[Fig. 11]
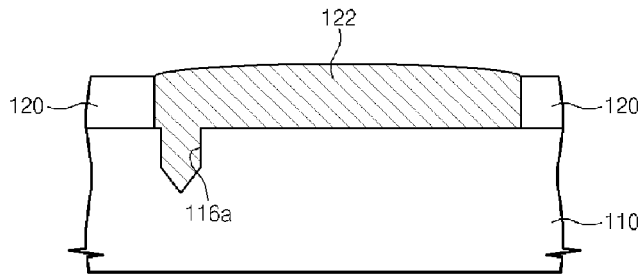

[Fig. 12]
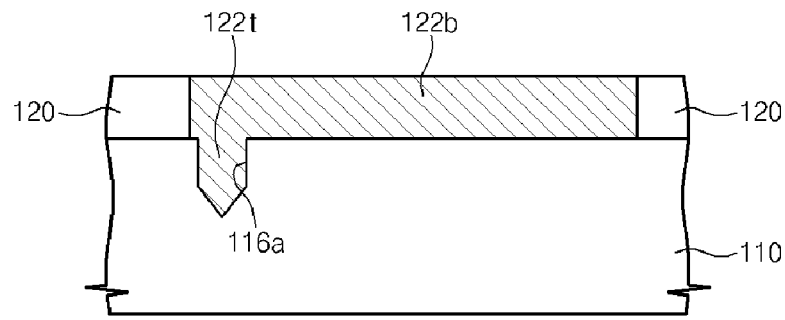
[Fig. 13]
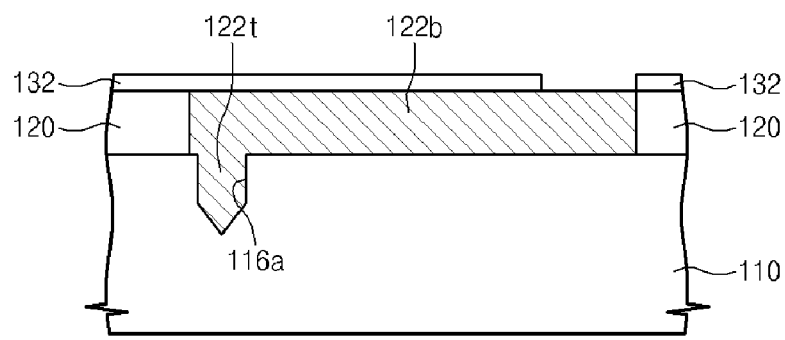
[Fig. 14]
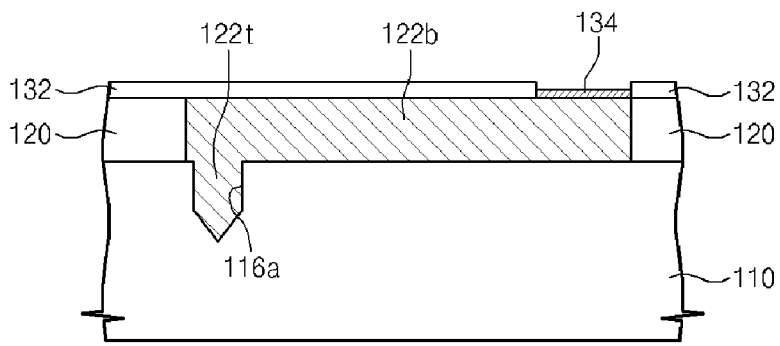
[Fig. 15]
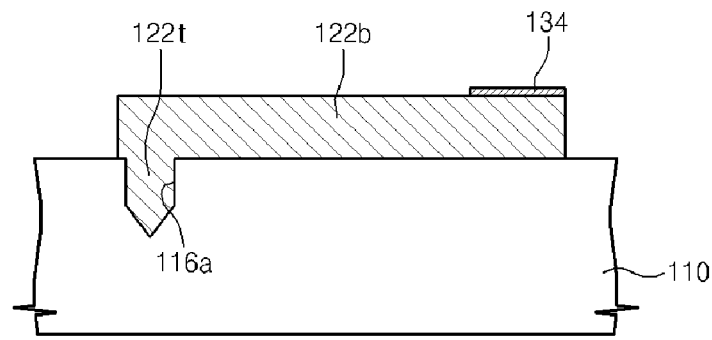

[Fig. 16]
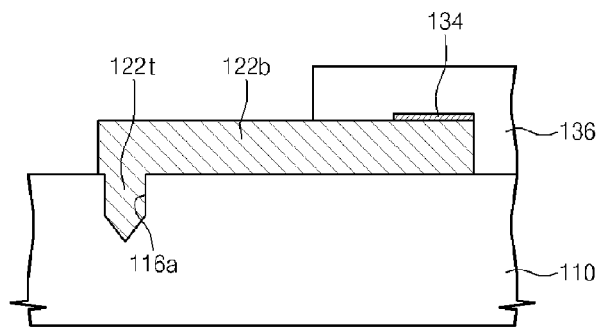
[Fig. 17]
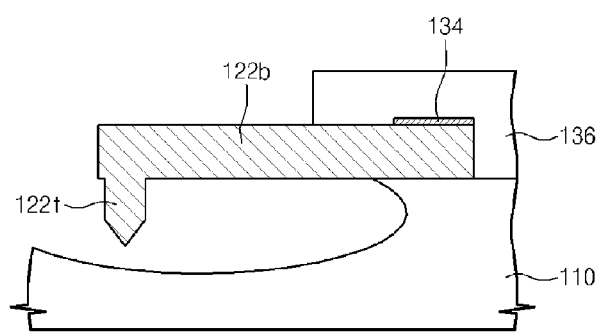
[Fig. 18]
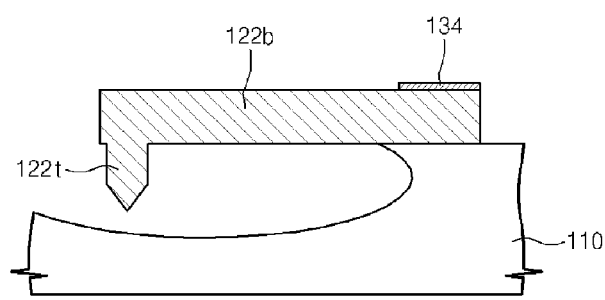
[Fig. 19]
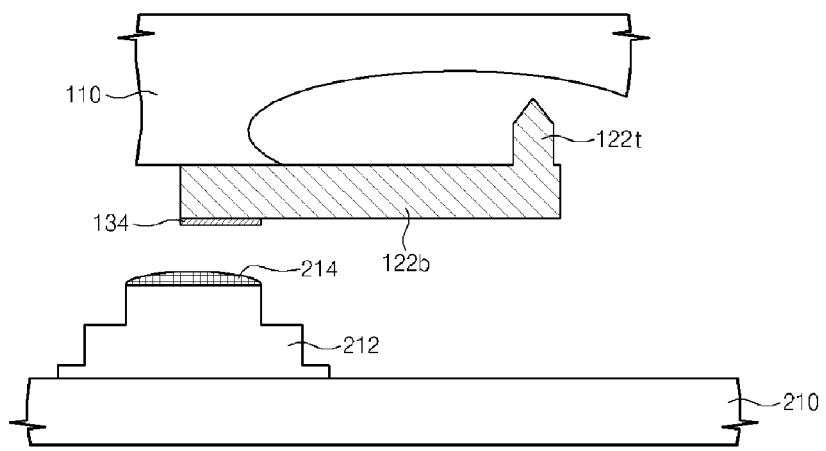

[Fig. 20]
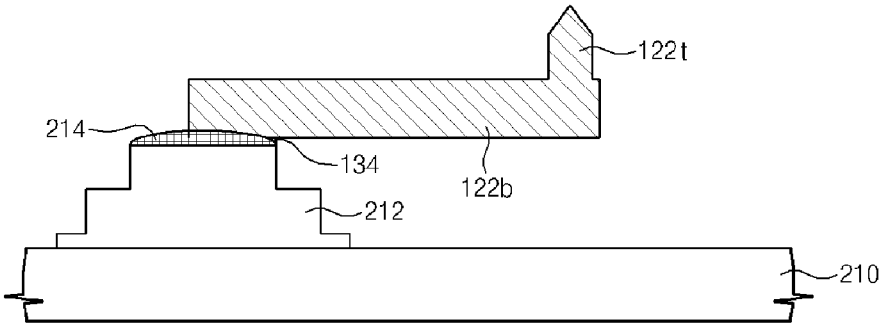
[Fig. 21]
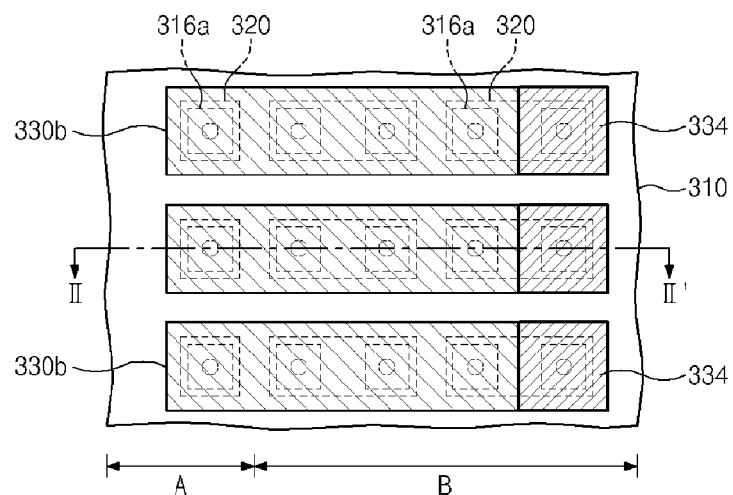
[Fig. 22]
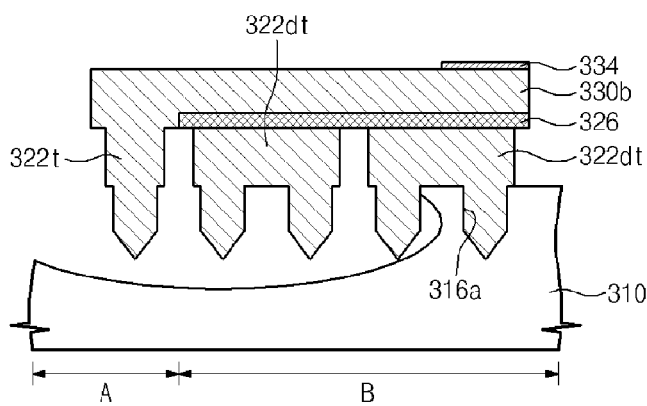
[Fig. 23]
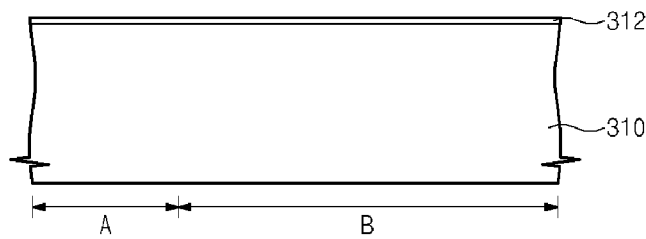

[Fig. 24]
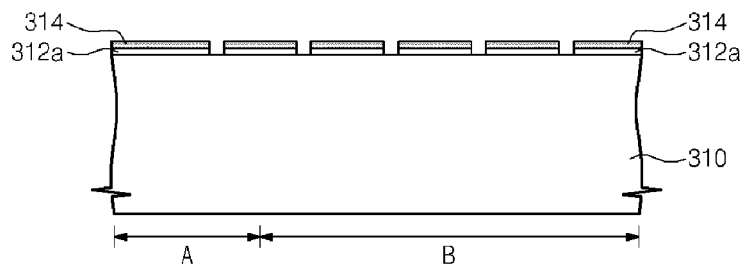
[Fig. 25]
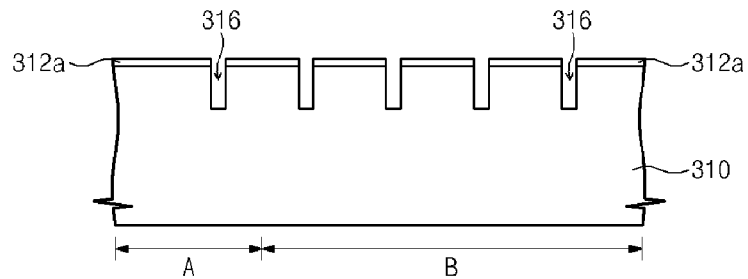
[Fig. 26]
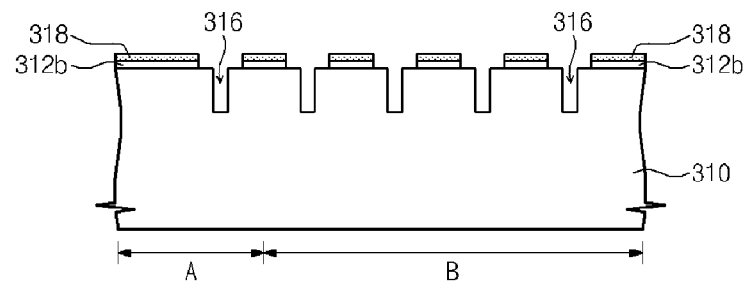
[Fig. 27]
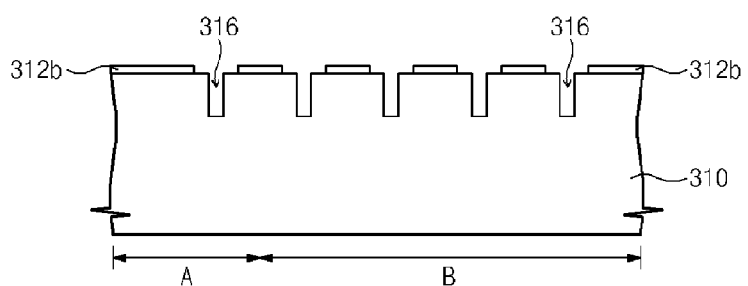
[Fig. 28]
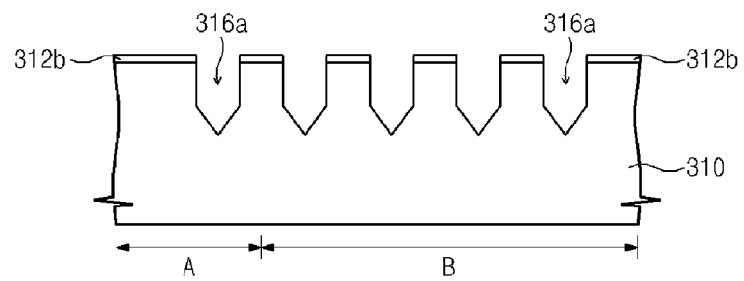

[Fig. 29]
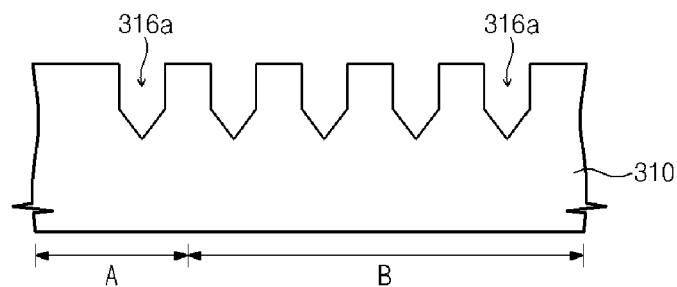
[Fig. 30]
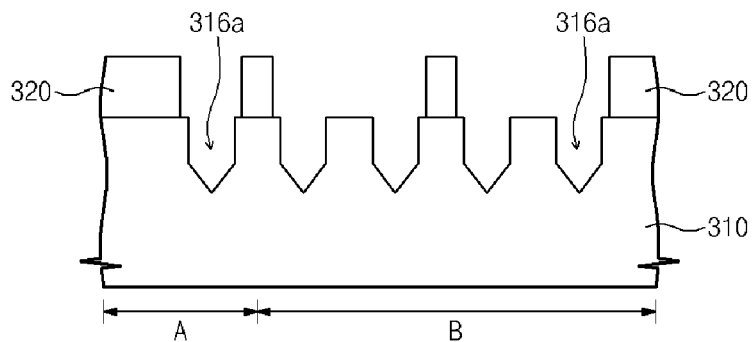
[Fig. 31]
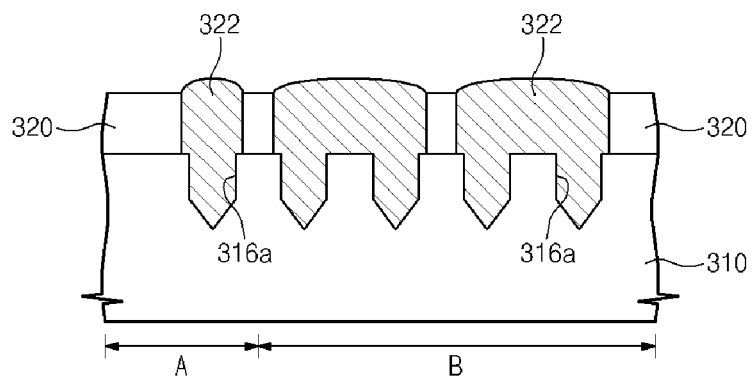
[Fig. 32]
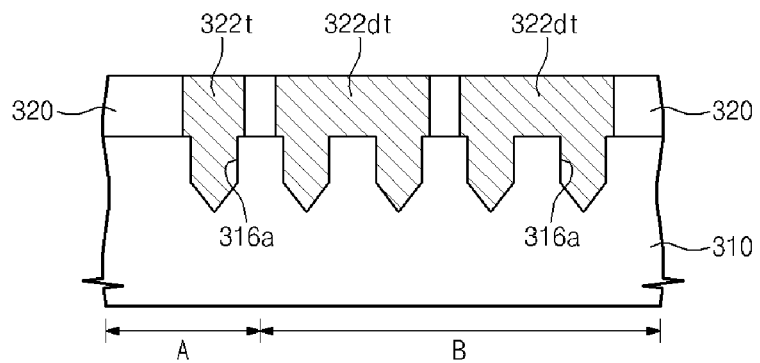

[Fig. 33]
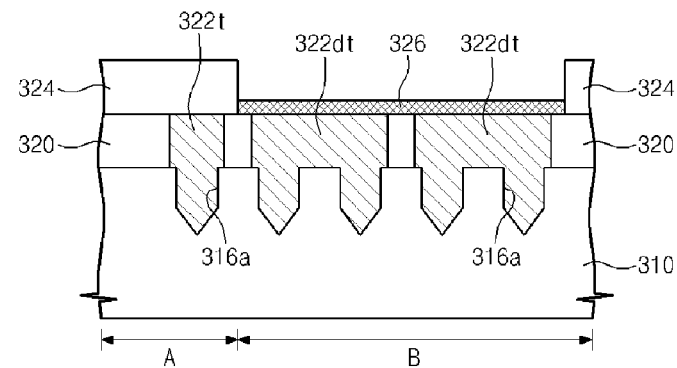
[Fig. 34]
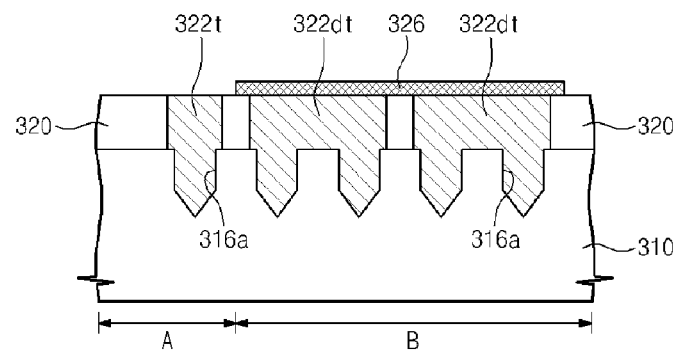
[Fig. 35]
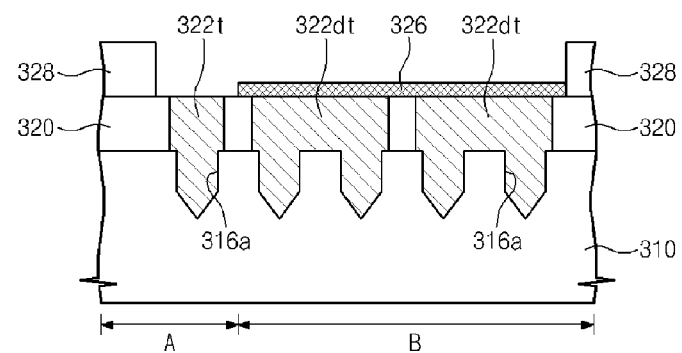
[Fig. 36]
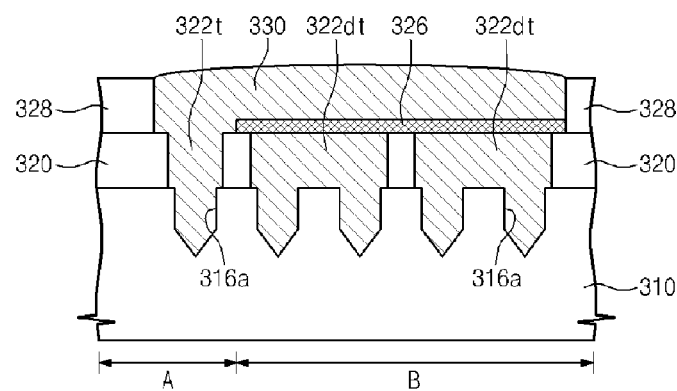

[Fig. 37]
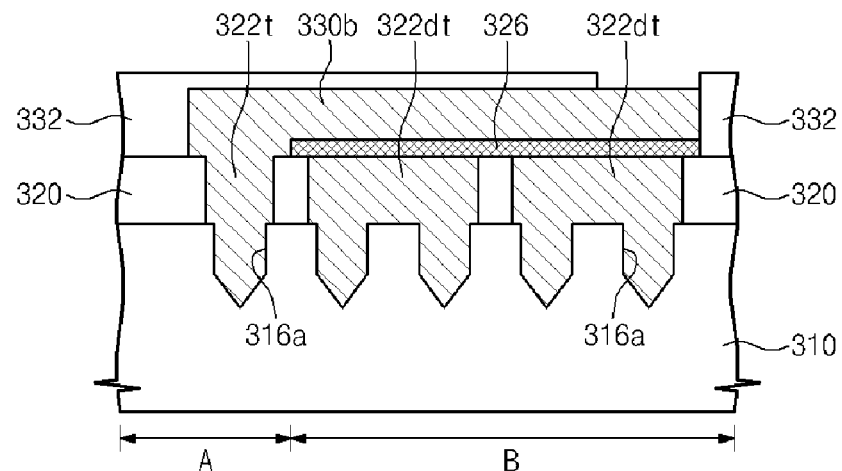
[Fig. 38]
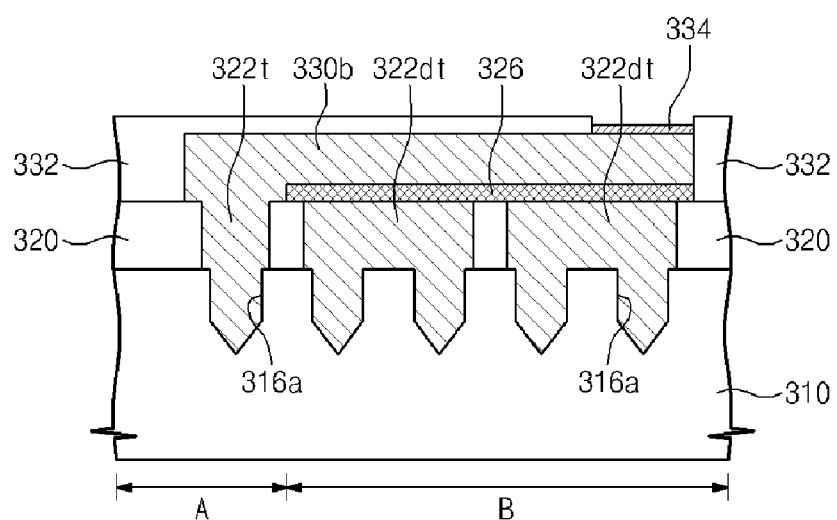
[Fig. 39]
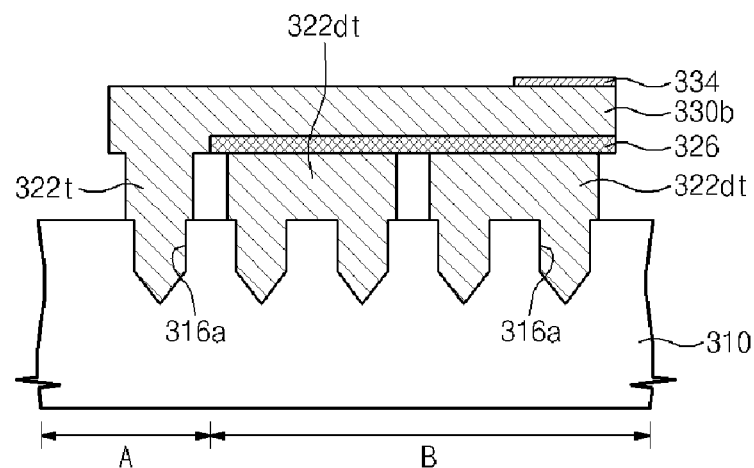

[Fig. 40]
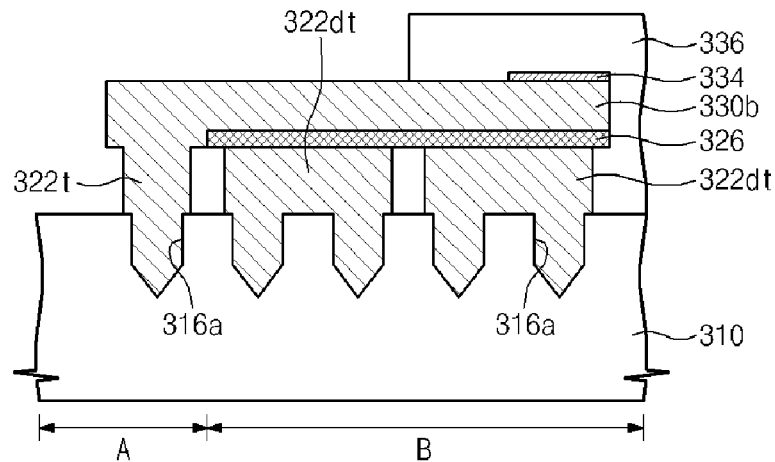
[Fig. 41]
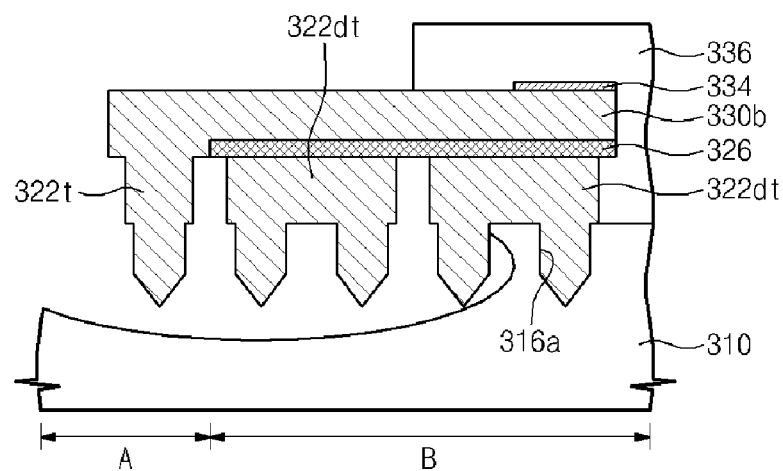
[Fig. 42]
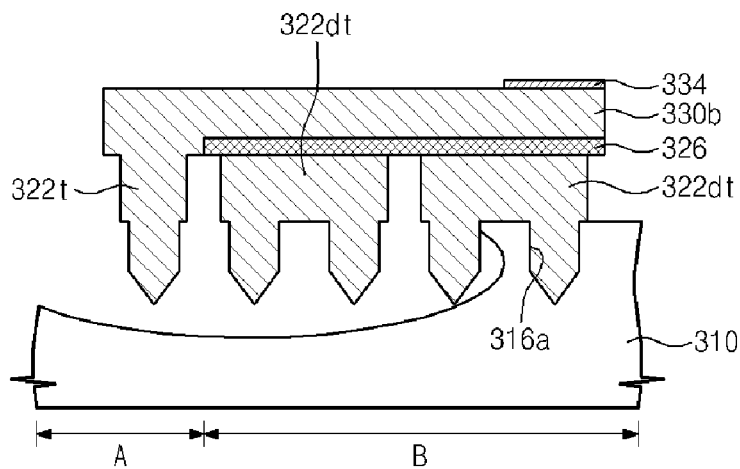

[Fig. 43]
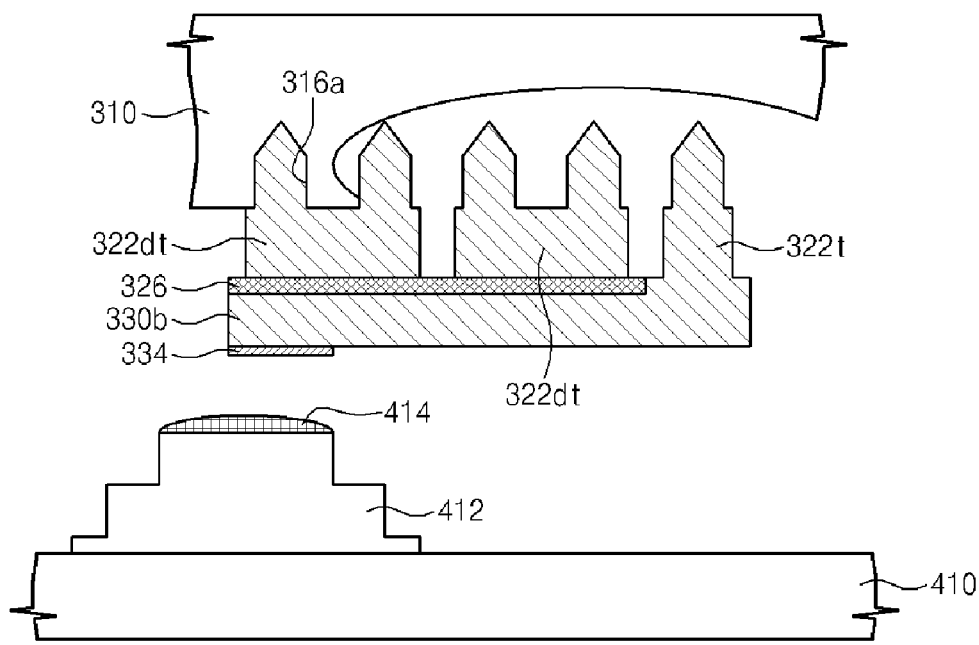
[Fig. 44]
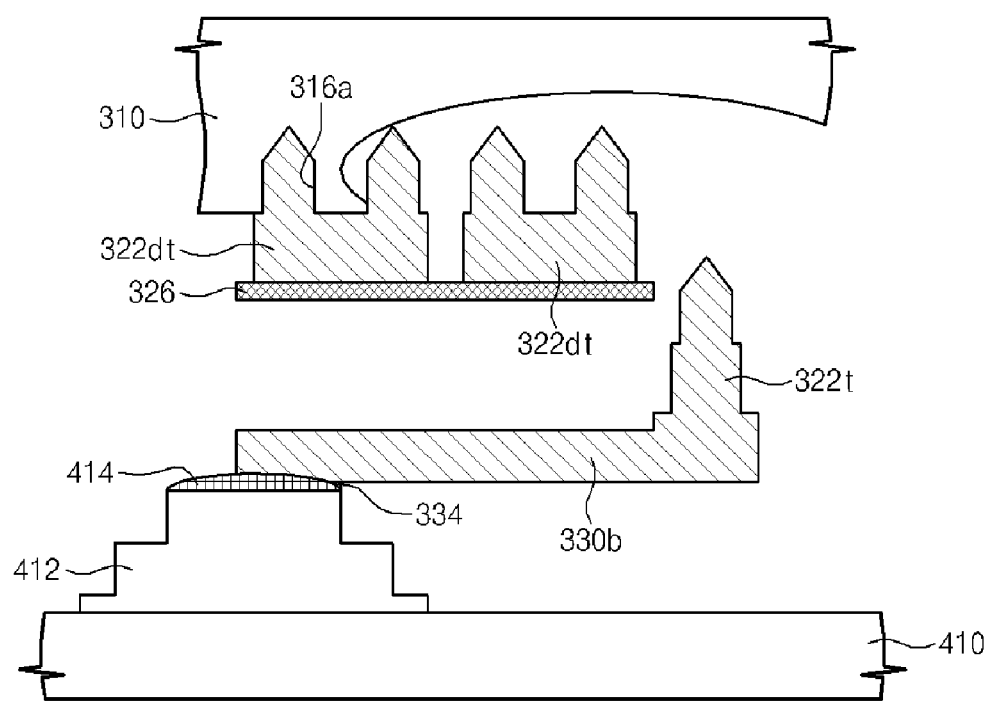

METHOD OF FABRICATING CANTILEVER TYPE PROBE AND METHOD OF FABRICATING PROBE CARD USING THE SAME

TECHNICAL FIELD

The present invention is concerned with electronic device test systems. In particular, the present invention described herein relates to a method of fabricating cantilever type probes (hereinafter, referred to as 'cantilever probe') for testing electrical characteristics by contacting to pads of microscopic electronic devices and a method of fabricating a probe card using the same.

BACKGROUND ART

Probes are mechanical tools for measuring electrical characteristics of microscopic electronic devices (e.g., semiconductor devices). As well known, a semiconductor device has a plurality of pads for communicate signals with an external electronic system. The semiconductor device executes internal operations with electrical signals input through the pads, and then transfers processed results to the external electronic system through the pads. During this, the probes are arranged on a printed circuit board of a probe card, physically contacting with the pads, so they form electrical paths for signal transmission with the external electronic system or device.

Probe cards, as well known, can be classified into needle, vertical, and cantilever types in accordance with kinds of probes. The needle type probe card has a disadvantage of distortion with horizontality and alignment due to repetitive use because its probe needles are insufficient in restoration. Additionally, since the probe needles of the needle type probe card are large in size with themselves, it is improper to be employed in testing a highly integrated semiconductor device. The vertical type probe card is otherwise appropriated as being suitable for testing a highly integrated semiconductor device because it is smaller in size and its probes are arranged in narrower intervals. But, in the vertical probe card, as force contacting a probe to a pad is oriented toward a lengthwise direction of the probe, it also has a problem of deformation due to insufficient restoration force.

Different from those types of probes, in a typical cantilever probe card, tips for contact with pads are bonded to ends of cantilever type beam portions. The beam portions are adhered to a printed circuit board in parallel with the tops of the pads. According to this, the force for contacting probes (i.e., the tip portions) of the cantilever type probe card to the pads operates vertically to the lengthwise direction of the beam portions. Such a structure of the cantilever type probe card provides the maximum restoration force thereto.

DISCLOSURE OF INVENTION

Technical Problem

In conventionally fabricating such a cantilever probe type card, it includes a process for adhering cantilever type beam portions to an electronic component, e.g., a printed circuit board, by means of bumps. However, physical force applied thereto during the adhering process would cause physical damages on probes.

Furthermore, the conventional fabrication way for the cantilever probe type card further includes processing steps of manufacturing probes by using a sacrificial substrate as a mold and removing the sacrificial substrate by means of an etchant in order to separate the probes therefrom. However, since removing the sacrificial substrate is needed to expose the probes in the etchant for a long time, the probes (esp., tip portions) would be affected from chemical stress that may incur product defects.

As a result, those tip portions damaged physically and chemically would be broken during a procedure of fabricating the probes or testing an electronic device.

Technical Solution

The present invention is directed to provide a method of fabricating cantilever probes capable of minimizing physical and chemical stress to tip portions during its manufacturing procedure.

The present invention is also directed to a method of fabricating a cantilever probe card capable of minimizing physical and chemical stress to tip portions while manufacturing probes.

An aspect of the present invention provides a method of fabricating cantilever probes. According to this method, a trench is formed in a predetermined region of a substrate. A mold layer pattern is formed on the substrate, including an opening to disclose a surface of the substrate including the trench. A tip portion is formed in the trench and a beam portion is formed in the opening. Then, the mold layer pattern is removed therefrom. The substrate is etched around the tip portion, floating the tip portion from the substrate.

Another aspect of the present invention is a method of fabricating a probe card. According to this method, the probe card is fabricated by, after adhering the cantilever probe, which is fabricated by the aforementioned, to a bump of a circuit board, etching and removing the substrate of the probe.

Still another aspect of the present invention is a method of fabricating cantilever probes. According to this method, the cantilever probe card is fabricated by the steps of: forming grooves in first and second regions of a substrate; forming a tip portion and a dummy tip portion which fill the grooves of the first and second regions, respectively; forming a sacrificial layer to cover the second region including the dummy tip portion; forming a beam portion to link with the tip portion and extend on the dummy tip portion with the sacrificial layer; and etching the substrate of the first region and floating the tip portion from the substrate.

Moreover, another aspect of the present invention is a method of fabricating a probe card. According to this method, the probe card is fabricated by, after adhering the cantilever probe, which is fabricated by the method as aforementioned, to a bump of a circuit board, etching the sacrificial layer of the probe and removing the substrate, the dummy tip portion, and the sacrificial layer of the probe.

Advantageous Effects

The cantilever probe formed by the embodiments of the present invention is advantageous in structure to minimize physical and chemical damages to the tip portion during a procedure of fabricating the probe card. Therefore, it highly reduces defects involved in the tip portion.

Thus, the methods of fabricating the cantilever probe and the probe card including the same in accordance with the present invention are helpful in producing probe cards with high stability and productivity.

BRIEF DESCRIPTION OF THE DRAWINGS

FIGS. 1 and 2 are plane and sectional views of formation including a cantilever probe in accordance with an embodiment of the present invention.

FIGS. 3 through 18 are sectional views taken along I-I' of FIG. 1, showing a method of fabricating a cantilever probe in accordance with an embodiment of the present invention.

FIGS. 19 and 20 are sectional views showing a method of fabricating a probe card in accordance with an embodiment of the present invention.

FIGS. 21 and 22 are plane and sectional views of formation including a cantilever probe in accordance with an embodiment of the present invention.

FIGS. 23 through 42 are sectional views taken along II-II' of FIG. 21, showing a method of fabricating a cantilever probe in accordance with an embodiment of the present invention.

FIGS. 43 and 44 are sectional vies showing a method of fabricating a probe card in accordance with an embodiment of the present invention.

BEST MODE FOR CARRYING OUT THE INVENTION

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification. In the figures, the dimensions of layers and regions are exaggerated for clarity of illustration. It will also be understood that when a layer (or film) is referred to as being on another layer or substrate, it can be directly on the other layer or substrate, or intervening layers may also be present. Like reference numerals refer to like elements throughout this specification.

FIG. 1 is a plane view of formation including a cantilever probe in accordance with an embodiment of the present invention, and FIG. 2 is a sectional view taken along I-I' of FIG. 1.

Referring to FIGS. 1 and 2, probes 122 are arranged on a sacrificial substrate 110. Each probe may be composed with including a tip portion 122t and a beam portion 122b. The probe may be further comprised of a joint portion 134. The tip portion 122t and the beam portion 122b may be formed of a conductive material filling a groove of an opening by a molding pattern (not shown) and a trench 116a, respectively. The tip portion 122t is disposed under a side of the beam portion 122b, while the joint portion 134 is disposed on the other side of the beam portion 122b for adhesion between the beam portion 122b and a circuit board.

FIGS. 3 through 18 are sectional views taken along I-I' of FIG. 1, showing a method of fabricating a cantilever probe in accordance with an embodiment of the present invention.

First, referring to FIG. 3, all over the sacrificial substrate 110 is formed a passivation layer 112 of oxide. It is preferred for the sacrificial substrate 110 to be made of a crystalline material so as to enable an anisotropic mode in the subsequent wet-etching process to form trenches. For instance, the sacrificial substrate 110 is preferred to be single crystalline silicon with orientation <1 0 0> on its top surface. The passivation layer 112 may be formed of at least one selected from silicon oxide, silicon nitride, silicon oxynitride, and photoresist. The passivation layer 112 used in this embodiment of the present invention may be formed of silicon oxide. Forming the passivation layer 112 with silicon oxide is accomplished by conducting thermal oxidation or chemical vapor deposition (CVD).

Next, referring to FIG. 4, a first photoresist pattern 114 is formed on the passivation layer 112 so as to result in a first passivation pattern 112a. The first photoresist pattern 114 may be used as an etching mask in the subsequent etching process for forming a preliminary trench. The first photoresist pattern 114 can be obtained from an exposing and developing process after coating a photoresist on the passivation layer 112 by way of a spin coating mode.

Using an etching mask by the first photoresist pattern 114 arranged on the passivation layer 112, the passivation layer 112 is selectively etched away in a wet or dry process and turns to a first passivation pattern 112a that defines a region in which the preliminary trench (refer to 116 of FIG. 5) is formed. The first photoresist pattern 114 may be removed from the top of the first passivation pattern 112a by means of a chemical material such as acetone.

Then, referring to FIG. 5, using the first passivation pattern 112a as an etching mask, a first anisotropic dry-etching process is carried out with utilizing gas by at least one selected from carbon tetra-fluoride ($CF_4$), sulfur hexa-fluoride ($SF_6$), cyclobutane octa-fluoride ($C_4F_8$), and oxygen ($O_2$) to form the preliminary trench 116. The first anisotropic dry-etching process may be accomplished by a reactive ion etching (RIE) mode that is known as one of deep trench etching methods. In this embodiment of the present invention, the processing gas is selected from carbon tetra-fluoride ($CF_4$), sulfur hexa-fluoride ($SF_6$), cyclobutane octa-fluoride ($C_4F_8$), and oxygen ($O_2$). Further, the preliminary trench 116 may be shaped in a tetragon having four sidewalls, e.g., a regular square.

Thereafter, referring to FIGS. 6 and 7, around the preliminary trench 116, a second photoresist pattern 118 is formed to disclose a top surface of the first passivation pattern 112a. The second photoresist pattern 118 may be formed from an exposing and developing process after coating a photoresist on the sacrificial substrate 110 in a predetermined thickness by means of a spin coating mode.

Using the second photoresist pattern 118 as an etching mask, the disclosed passivation pattern 112a is selectively etched away in a wet or dry process and turns to a second passivation pattern 112b. The second passivation pattern 112b may be used as an etching mask in the subsequent etching step for trench. According to this, the second passivation pattern 112b may disclose the top surface of the sacrificial substrate 110 wider than the first passivation pattern 112a.

The second photoresist pattern 118 may be removed by means of a chemical material such as acetone.

Next, referring to FIG. 8, the sacrificial substrate 110, from which the second photoresist pattern 118 is removed, is etched to form a trench 116a enlarged more than the preliminary trench 116 in width and depth. This etching process is preferred to use potassium hydroxide (KOH), tetra-methyl ammonium hydroxide (TMAH), or ethylene diamine pyrochatecol (EDP) as an etchant.

As well known, when the etchant is used with potassium hydroxide (KOH), tetra-methyl ammonium hydroxide (TMAH), or ethylene diamine pyrochatecol (EDP), an etch rate of a silicon substrate is dependent on a crystalline orientation. For example, a silicon substrate structured in the <1 0 0> orientation may be etched faster along the lateral direction rather than the downward direction. As a result, the preliminary trench 116 is more enlarged along the lateral direction rather than the downward direction, so that the trench 116a has a wide upper portion and a lower portion gradually narrower downward as illustrated in FIG. 8.

According to the present invention, it is able to increase a depth of the trench 116a by conducting a secondary anisotropic dry-etching process to the resultant structure, where the preliminary trench 116 is extended, with using the second passivation pattern 112b as an etching mask. It is preferred for the second anisotropic dry-etching process to utilize at least one selected from carbon tetra-fluoride ($CF_4$), sulfur hexa-fluoride ($SF_6$), cyclobutane octa-fluoride ($C_4F_8$), and oxygen ($O_2$). The secondary anisotropic dry-etching process may be accomplished by a reactive ion etching mode that is well known as a way of forming a deep trench. Here, the secondary anisotropic dry-etching process may be selectively carried out in need. For instance, the secondary anisotropic dry-etching process may be carried out to shape the trench 116a, which has been formed by the former anisotropic wet-etching process, into a gentle slope. Thus, the trench 116a may be formed in an octagon.

Then, referring to FIGS. 9 and 10, after forming the trench 116a, it removes the second passivation pattern 112b that has been used as an etching mask for shaping the trench 116a. The second passivation pattern 112b may be removed therefrom by means of a chemical material such as hydrogen fluoride (HF).

According to the present invention, on the sacrificial substrate 110 including the trench 116a, a plating electrode (not shown) may be conformally formed to offer convenience of a subsequent electroplating process. The plating electrode may be made of titanium (Ti) and copper (Cu) layers sequentially stacked by a sputtering process.

After removing the second passivation pattern 112b, a mold layer pattern 120 is formed on the sacrificial substrate 110 including the trench 116a. The mold layer pattern 120 may be made of at least one selected from silicon oxide, silicon nitride, silicon oxynitride, and photoresist. The mold layer pattern 120 by this embodiment of the present invention may be formed by means of an exposing and developing process after coating a photoresist on the sacrificial substrate 110 in a predetermined thickness.

According to an embodiment of the present invention, in the mold layer pattern 120 is an opening to disclose the trench 116a. The trench 116a and the opening may be used as a mold for defining a tip portion and a beam portion of the probe. Namely, the trench 116a and the opening by the mold layer pattern 120 are able to form a groove defining the tip portion and the beam portion of the probe, respectively.

Thereafter, referring to FIGS. 11 and 12, a conductive layer 122 is formed to fill the groove settled in the passivation substrate 110. The conductive layer 122 may be formed by at least one selected from processing techniques of electroplating, chemical vapor deposition, and sputtering. The conductive layer 122 may be made of a nickel-cobalt (Ni—Co) alloy. In the conductive layer 122 by this embodiment of the present invention may be formed by the electroplating process.

Then, the conductive layer 122 is polished and planarized until disclosing the top of the mold layer pattern 120. As a result, the tip portion 122t and the beam portion 122b are formed. Polishing and planarizing the conductive layer 122 may be accomplished by a chemical mechanical polishing (CMP) or grinding process.

Successively, referring to FIGS. 13 and 14, a first mask pattern 132 is formed to disclose the top of an end of the beam portion 122b. The first mask pattern 132 may be made of at least one selected from silicon oxide, silicon nitride, silicon oxynitride, and photoresist. The first mask pattern 132 in this embodiment of the present invention may be formed by means of an exposing and developing process after coating a photoresist on the sacrificial substrate 110 in a predetermined thickness.

Next, the joint portion 134 is formed on the top of the beam portion 122b which is disclosed by the first mask pattern 132. The joint portion 134 may be used as an adhesive part through which the probe is joined to a printed circuit board in the subsequent processing step. The joint portion 134 may be made of gold (Au).

If the joint portion 134 for connection with the beam portion 122b is preliminarily provided to a predetermined region of the printed circuit board to which the probe adheres, it is permissible to skip the processing step for setting the joint portion 134 shown in FIGS. 13 and 14.

After then, referring to FIGS. 15 and 16, the first mask pattern 132 and the mold layer pattern 120 are removed by means of a wet-etching mode using a chemical solution. Continuously, a second mask pattern 136 is formed to disclose the sacrificial substrate 110 around the tip portion 122t, at least covering the joint portion 134. The second mask pattern 136 may be made of at least one selected from silicon oxide, silicon nitride, silicon oxynitride, and photoresist. The second mask pattern 136 by this embodiment of the present invention may be formed by means of an exposing and developing process after coating a photoresist on the sacrificial substrate 110 in a predetermined thickness.

Now, referring to FIGS. 17 and 18, using the second mask pattern 136 as an etching mask, the sacrificial substrate 110 is partially etched away around the tip portion 122t until disclosing at least the lower part and side of the tip portion 122t. This process for etching the sacrificial substrate 110 around the tip portion 122t is preferred to be carried out by way of a dry-etching mode using plasma. Since the second mask pattern 136 covers only a predetermined part of the beam portion 122b, including the joint portion 134 as well, the tip portion 122t can be wholly disclosed thereby. Accordingly, as shown in FIG. 17, the tip portion 122t may be floated from the sacrificial substrate 110.

Thereafter, the second mask pattern 136 is removed to disclose the joint portion 134. This process is preferred to be carried out by way of a wet-etching mode using a chemical solution. Thus, under the probe consisting of the tip portion 122t, the beam portion 122b, and the joint portion 134, the sacrificial substrate 110 partially remains, without being etched away, with contacting to the beam portion 122b. During this, the probe may contact directly to the sacrificial substrate 110 through the beam portion 122b not through a peripheral region of the tip portion 122t.

FIGS. 19 and 20 are sectional vies showing a method of fabricating a probe card in accordance with an embodiment of the present invention.

Referring to FIGS. 19 and 20, in addition to the structure of FIG. 18 including a probe, a circuit board 210 is prepared to which the probe adheres. For adhesion to the joint portion 134 of the probe, a bump 212 may be formed at a predetermined position of the circuit board 210. Furthermore, a solder 214 may be formed on the surface of the bump 212. The solder 214 may be made of an alloy of gold (Au) and tin (Sn).

In purpose of fabricating a probe card, the joint portion 134 of the probe is adhered to the solder 214 placed on the surface of the bump 212 of the circuit board 210. This adhesive process may include a step of physically pressing and heating up the solder 214. During this, the beam portion 122b directly contacting to the sacrificial substrate 110 may be used as a structural supporter to prevent the probe from a physical damage. Further, as aforementioned, as the tip portion 122t is formed in a structure floated from the sacrificial substrate 110, it is able to prevent the tip portion 122t from a physical damage due to a contact with the sacrificial substrate 110 during the adhesion process. Namely, different from the conventional type, the present invention offers a feature of joining the probe to the circuit board 210 without any physical damage.

After joining the probe to the circuit board 210, the remaining sacrificial substrate 110 contacting with the beam portion 122b is etched away to isolate the probe therefrom. As aforementioned, the tip portion 122t of the probe is floated from the sacrificial substrate 110. According to this, while removing the sacrificial substrate 110 in order to entirely disclose the probe, different from the conventional type, it is possible to minimize chemical damages to the tip portion 122t.

FIG. 21 is a plane view of formation including a cantilever probe in accordance with an embodiment of the present invention, and FIG. 22 is a sectional view taken along II-II' of FIG. 21.

Referring to FIGS. 21 and 22, a probe is disposed on a sacrificial substrate 310. The probe may be composed of a tip portion 322t and a beam portion 330b. The probe may further include a joint portion 334. The tip portion 322t may be formed of a conductive material filling grooves of openings by a mold layer pattern (not shown) and trenches 316a, respectively. The tip portion 522t is disposed under a side of the beam portion 330b and the joint portion 334 is disposed on the other side of the beam portion 330b. The joint portion 334 may be formed on the other side of the beam portion 330b for adhesion between the beam portion 330b and a circuit board. Under the beam portion 330b, dummy tip portions 322dt may be further provided with being isolated from the beam portion 330b by a sacrificial layer 326. The dummy tip portions 322dt may be made of a conductive material filling grooves under the beam portion 330b. In describing this embodiment relevant to FIGS. 21 and 21, the region of the sacrificial substrate 310 where the tip portion 322t is formed is referred to as 'first region' A, while the region of the sacrificial substrate 310 where the dummy tip portions 322dt is formed is referred to as 'second region' B.

FIGS. 23 through 42 are sectional views taken along II-II' of FIG. 21, showing a method of fabricating a cantilever probe in accordance with an embodiment of the present invention. It will be omitted or described in brief the similar to the aforementioned processing ways exemplified by FIGS. 3 through 18.

First, referring to FIGS. 23 through 30, a passivation layer 312 of oxide is deposited all over the sacrificial substrate 310. On the passivation layer 312 is formed a first photoresist pattern 314 for a first passivation pattern 312a. Using an etching mask with the first photoresist pattern 314 that is laid on the passivation layer 312, the passivation layer 312 is partially removed in a wet or dry-etching process to form the first passivation pattern 312a defining a region in which preliminary trenches (refer to 316 of FIG. 25).

The first photoresist pattern 314 is removed from the top of the first passivation pattern 312a. With an etching mask by the first passivation pattern 312a, a first anisotropic dry-etching process is carried out to form the preliminary trenches 316. The preliminary trenches 316 may be shaped in a tetragon having four sidewalls. It is preferred for the preliminary trenches 316 to be formed in a regular square.

Around the preliminary trenches 316, a second photoresist pattern 318 is formed to disclose the top of the first passivation pattern 312a. Using the second photoresist pattern 318 as an etching mask, the disclosed first passivation pattern 312a is partially removed in a wet or dry-etching process to form a second passivation pattern 312b. Then, the second photoresist pattern 318 is removed therefrom. Thus, the second passivation pattern 312b is arranged to further disclose the top of the sacrificial substrate 310 broader than the first passivation pattern 312a.

The sacrificial substrate 310 without the second photoresist pattern 318 is selectively etched to trenches 316a each of which is larger than the preliminary trenches 316 in width and depth. This etching process is preferred to use an etchant with potassium hydroxide (KOH), tetra-methyl ammonium hydroxide (TMAH), or ethylene diamine pyrochatecol (EDP).

As well known, if the etchant is used with potassium hydroxide (KOH), tetra-methyl ammonium hydroxide (TMAH), or ethylene diamine pyrochatecol (EDP), an etching rate in a silicon substrate is dependent on a crystalline orientation. For instance, in a silicon substrate with <1 0 0> orientation, an etching rate is higher along its lateral direction rather than its downward direction. As a result, the preliminary trench 316 extends along the lateral direction rather than the downward direction in the sacrificial substrate 310, and thereby the trench 316a is formed with having a wide upper part and a gradually narrowing lower part.

According to the present invention, a secondary anisotropic dry-etching process is carried out on the resultant structure including the preliminary trenches 316, using the second passivation pattern 312b as an etching mask. Thus, the trenches 316a become larger in depth. For instance, the secondary anisotropic dry-etching process may be carried out to smooth the shape of the trenches 316a formed by the former anisotropic wet-etching process. According to this, the trench 316a is formed in the pattern of octagon.

After completing the trenches 316a, it removes the second passivation pattern 312b that has been used as the etching mask in the etching process to form the trenches 316a. After removing the second passivation pattern 312b, a mold layer pattern 320 is formed on the sacrificial substrate 310 including the trenches 316a. The mold layer pattern 320 may be made of at least one selected from silicon oxide, silicon nitride, silicon oxynitride, and photoresist. The mold layer pattern 320 by this embodiment of the present invention may be formed by means of an exposing and developing process after coating a photoresist on the sacrificial substrate 310 in a predetermined thickness.

According to this embodiment by the present invention, in the mold layer pattern 320 are formed a plurality of openings to disclose the trenches 316a. In this structure, the first region A includes one opening to disclose one of the trenches 316a, while the second region B includes plural openings to disclose a plurality of the trenches 316a. The trench 316a and opening of the first region A may be used as a mold to define the tip portion of the probe. The trenches 316a and openings of the second region B are used for molds of the dummy tip portions functioning as structural supporters while joining the probe with the circuit board. Namely, the openings by the mold layer pattern 320 and the trenches 316a may form grooves for defining the tip portion and dummy tip portions.

Then, referring to FIGS. 31 and 32, on the sacrificial substrate 310, a first conductive layer 322 is formed to fill the grooves in the first and second regions A and B. The first conductive layer 322 may be formed by means of at least one selected from techniques of electroplating, CVD, and sputtering. The first conductive layer 322 may be made of an alloy of nickel (Ni) and cobalt (Co). The first conductive layer 322 by this embodiment of the present invention may be formed by an electroplating technique.

Thereafter, the first conductive layer 322 is polished and planarized until disclosing the top of the mold layer pattern 320. As a result, the first region A has the tip portion 322t while the second region B has a plurality of the dummy tip portions 322*dt*. The process of polishing and planarizing the first conductive layer 322 may be used with a chemical mechanical polishing (CMP), etch-back, or grinding technique. As aforementioned in conjunction with FIG. 30, as the mold layer pattern 320 has one or more openings including one or more trenches 316*a* formed in the sacrificial substrate 310 of the second region B, a side of the tip portion 322*t* may include at least one or more dummy tip portions 322*dt*.

Next, referring to FIGS. 33 and 34, on the resultant structure including the tip portion 312*t* and the dummy tip portions 322*dt*, a first mask pattern 324 is formed to disclose the top of the second region B. A process of forming the first mask pattern 324 is carried out with including a step of coating a photoresist with a predetermined thickness and then exposing and developing the photoresist.

According to this embodiment of the present invention, before arranging the first mask pattern 324, it is able to form a plating electrode (not shown) of a sequentially stacked titanium and copper layer, in convenience of a subsequent electroplating process for the beam portion, on the resultant structure including the tip portion 322*t* and the dummy tip portions 322*dt*. During this, the titanium and copper layer may be deposited thereon by means of a sputtering process.

The sacrificial layer 326 is deposited on top of the second region B that is disclosed by the first mask pattern 324. The sacrificial layer 326 may be formed to easily remove the dummy tip portions 322*dt* from the beam portion in the subsequent process for removing the sacrificial substrate 310. From the reason, it is preferred for the sacrificial layer 326 to be made of a material removable with minimizing an etch amount of the probe. For example, the sacrificial layer 326 may be made of copper (Cu) or zinc (Zn).

Continuously, the first mask pattern 324 is removed therefrom. Removing the first mask pattern 324 is preferred to use an ashing mode so as to prevent the mold layer pattern 320 from being etched away. This is because the mold layer pattern 320 would be etched along with the first mask pattern 324 in a normal wet-etching process.

Next, referring to FIGS. 35 and 36, the second mask pattern 328 is formed with including an opening to define the beam portion. The opening of the second mask pattern 328, as shown herein, may be formed to disclose at least the tops of the sacrificial layer 326 and the tip portion 322*t*. The second mask pattern 328 may be made of at least one selected from silicon oxide, silicon nitride, silicon oxynitride, and photoresist. The second mask pattern 328 by this embodiment of the present invention may be formed by way of an exposing and developing process after coating a photoresist on the sacrificial substrate 310 in a predetermined thickness.

Thereafter, a second conductive layer 330 is formed to cover the second mask pattern 328. The second conductive layer 330 may be formed by means of at least one selected from techniques of electroplating, CVD, and sputtering. The second conductive layer 330 may be made of a Ni—Co alloy as same with the first conductive layer 322. The second conductive layer 330 by this embodiment of the present invention may be formed by an electroplating process.

In forming the second conductive layer 330 by means of an electroplating process, the plating electrode (not shown) for the beam portion, as aforementioned with reference to FIG. 33, is preferred to be removed from the top of the tip portion 322*t* in purpose of a direct contact between the tip portion 322*t* and the beam portion.

After then, the second conductive layer 330 is polished and planarized to form the beam portion 330*b* that contacts with the tip portion 322*t* and extends upward the dummy tip portions 322*dt* on which the sacrificial layer 326 is formed. Polishing and planarizing the second conductive layer 330 is carried out by a CMP, etch-back, or grinding process. During this, as described with reference to FIG. 33, the beam portion 330 may be formed without contacting directly to the dummy tip portions 322*dt* placed by the sacrificial layer 326 in the second region B.

Next, referring to FIGS. 37 and 38, after removing the second mask pattern 328, a third mask pattern 332 is formed to disclose the top of an end of the beam portion 330*b* in the second region B. The third mask pattern 332 may be made of at least one selected from silicon oxide, silicon nitride, silicon oxynitride, and photoresist. The third mask pattern 332 by this embodiment of the present invention may be formed by an exposing and developing process after coating a photoresist on the sacrificial substrate 310 in a predetermined thickness.

Removing the second mask pattern 328 is preferred to use an ashing mode so as to prevent the mold layer pattern 320 from being etched away. This is because the mold layer pattern 320 would be etched along with the second mask pattern 328 in a normal wet-etching process. Further, without removing the second mask pattern 328, the third mask pattern 332 may be formed even on the second mask pattern 328. According to this, the second mask pattern 328 remaining without being removed may be removed together with the third mask pattern 332 in the subsequent processing step.

The joint portion 334 is formed on the beam portion 330*b*, which is partially disclosed by the third mask pattern 332, in the second region B. The joint portion 334 may be used as adhesive means for joining the probe with the circuit board in the subsequent processing step. The joint portion 334 may be made of gold.

If the joint portion 334 is provided to a predetermined place of the circuit board, to which the probe is adhered in a procedure of fabricating the probe card, in order to join the beam portion 330*b* with the circuit board, it is permissible to skip a step of forming the joint portion 334 described with reference to FIG. 38.

Then, referring to FIGS. 39 and 40, the third mask pattern 332 and the mold layer pattern 320 are removed by means of a wet-etching mode with a chemical solution. Subsequently, a fourth mask pattern 336 is formed to disclose the first region A, while covering the joint portion 334 at least. The fourth mask pattern 336 may be made of at least one selected from silicon oxide, silicon nitride, silicon oxynitride, and photoresist. The fourth mask pattern 336 by this embodiment of the present invention may be formed by means of an exposing and developing process after coating a photoresist on the sacrificial substrate 310 in a predetermined thickness.

Referring to FIGS. 41 and 42, using the fourth mask pattern 336 as an etching mask, the sacrificial substrate 310 of the first region A is selectively etched until disclosing at least the lower part and side of the tip portion 322*t*. Etching the sacrificial substrate 310 of the first region A is preferred to be conducted in a dry-etching process with plasma. As the fourth mask pattern 336 covers a predetermined part of the second region B including the joint portion 334, the tip portion 322*t* formed in the first region A may be entirely disclosed while the dummy tip portions 322*dt* may be disclosed in part. Accordingly, as shown in FIG. 41, the tip portion 322*t* disposed in the first region A can be floated from the sacrificial substrate 310.

After then, the fourth mask pattern 336 is removed to disclose the joint portion 334. This process is preferred to be conducted by a wet-etching process with a chemical solution. Thus, the sacrificial layer 326, the dummy tip portions 322*dt*, and the sacrificial substrate 310 remain under the probe composed of the tip portion 322t, the beam portion 330b, and the joint portion 334. In this structure, the probe is connected indirectly with the sacrificial substrate 310 through the sacrificial layer 326 and the dummy tip portions 322dt, without being connected directly with the sacrificial substrate 310.

FIGS. 43 and 44 are sectional vies showing a method of fabricating a probe card in accordance with another embodiment of the present invention.

Referring to FIGS. 43 and 44, in addition to the structure of FIG. 42 including a probe is prepared, a circuit board 410 is manufactured to which the probe adheres. In order to fabricate a probe card, the joint portion 334 of the probe is adhered to a solder 414 formed on a bump 412 of the circuit board 410. This adhesion process may be carried out with including a step of physically pressing and heating up the solder 414. During this, the dummy tip portions 322dt directly joining with the sacrificial substrate 310 may be used as structural supporters to prevent physical damages of the probe. Further, as aforementioned, since the tip portion 322t is floated from the sacrificial substrate 310, it is able to prevent the tip portion 322t from a physical damage due to a contact with the sacrificial substrate 310. Namely, different from the conventional arts, the present invention offers a feature capable of joining the probe with the circuit board 410 without any physical damage.

After joining the probe with the circuit board 410, the sacrificial layer 326 is etched away to separate the probe from sacrificial substrate 310. The sacrificial layer 326 may be etched by means of an etchant suitable therefor. According to the embodiment of the present invention, as the sacrificial layer 326 is made of copper (Cu) or zinc (Zn), the etchant may be used with a copper-specific or zinc-specific etchant. As aforementioned, the probe is being connected to the sacrificial substrate 310 through the sacrificial layer 326 and the dummy tip portions 322dt. Thus, as aforementioned, from etching the sacrificial layer 326, the probe can be separated from the sacrificial substrate 310 in easy. Thereby, while removing the sacrificial substrate 310 in order to entirely disclose the probe, different from the conventional cases, it is able to minimize chemical damages to the tip portion 322t.

INDUSTRIAL APPLICABILITY

The invention is applicable to testing microscopic electronic devices having pads.

The invention claimed is:

1. A method of fabricating cantilever type probes, comprising:
   forming grooves in first and second regions of a substrate;
   forming a tip portion and a dummy tip portion which fill the grooves of the first and second regions, respectively;
   forming a sacrificial layer to cover the second region including the dummy tip portion;
   forming a beam portion to link with the tip portion and extend on the dummy tip portion with the sacrificial layer;
   etching the substrate of the first region and floating the tip portion from the substrate;
   adhering the cantilever type probe to a bump of a circuit board; and
   etching the sacrificial layer of the probe and removing the substrate, the dummy tip portion, and the sacrificial layer of the probe.

2. The method according to claim 1, wherein forming the grooves comprises:
   forming a first passivation pattern with a plurality of first openings, on the substrate, to disclose predetermined top surfaces of the substrate;
   etching the substrate by using the first passivation pattern as an etching mask and forming preliminary trenches under the first openings;
   etching the first passivation pattern and forming a second passivation pattern with second openings to disclose predetermined regions of the substrate which includes the preliminary trenches;
   etching the substrate by using the second mask pattern as an etching mask and forming a plurality of trenches under the second openings; and
   forming a mold layer pattern with third openings to disclose predetermined top surfaces of the substrate which includes the trenches,
   wherein the grooves are comprised of the trenches and the third openings.

3. The method according to claim 2, wherein the mold layer pattern is formed to disclose the predetermined top surfaces of the substrate which include the plural trenches in the second region.

4. The method according to claim 2, which further comprises: removing the mold layer pattern after forming the beam portion.

5. The method according to claim 2, wherein the first passivation pattern is made of at least one selected from silicon oxide, silicon nitride, silicon oxynitride, and photoresist,
   wherein the second passivation pattern is made of at least one selected from silicon oxide, silicon nitride, silicon oxynitride, and photoresist,
   wherein the mold layer pattern is made of at least one selected from silicon oxide, silicon nitride, silicon oxynitride, and photoresist.

6. The method according to claim 1, wherein forming the tip portion and the dummy tip portion comprises:
   forming a first conductive layer to fill the grooves and cover the substrate; and
   polishing and planarizing the first conductive layer.

7. The method according to claim 1, wherein forming the sacrificial layer comprises:
   forming a first mask pattern to disclose the top surface of the substrate of the second region;
   forming the sacrificial layer in the second region disclosed by the first mask pattern; and
   removing the first mask pattern.

8. The method according to claim 1, wherein the sacrificial layer is formed with including a material having etching selectivity to the substrate, the tip portion, and the beam portion.

9. The method according to claim 8, wherein the sacrificial layer is formed with including copper or zinc.

10. The method according to claim 1, wherein forming the beam portion comprises:
    forming a second mask pattern to disclose the sacrificial layer and the tip portion on the resultant structure including the sacrificial layer;
    forming a second conductive layer to cover the second mask pattern;
    polishing and planarizing the second conductive layer until disclosing the second mask pattern; and
    removing the second mask pattern.

11. The method according to claim 1, which further comprises, after forming the beam portion:

forming a third mask pattern to disclose the top surface of an end of the beam portion in the second region on the resultant structure including the beam portion;

forming a joint portion on the beam portion disclosed by the third mask pattern; and removing the third mask pattern.

12. The method according to claim 1, wherein etching the substrate of the first region comprises:

forming a fourth mask pattern to disclose the first region on the resultant structure including the beam portion; and etching the substrate of the disclosed first region by using the fourth mask pattern as an etching mask and disclosing the tip portion.

13. The method according to claim 12, wherein etching the substrate of the first region is carried out in a dry-etching process until floating the tip portion from the substrate.

14. The method according to claim 12, which further comprises: removing the fourth mask pattern after disclosing the tip portion.

15. The method according to claim 1, wherein adhering the probe to the circuit board is carried out with using a structural supporter by the dummy tip portion.

16. The method according to claim 1, wherein removing the substrate, the dummy tip portion, and the sacrificial layer of the probe is carried out by selectively etching the sacrificial layer and separating the probe from the substrate including the dummy tip portion.

* * * * *